US011336305B2

(12) United States Patent
Funaoka et al.

(10) Patent No.: US 11,336,305 B2
(45) Date of Patent: May 17, 2022

(54) MEMORY SYSTEM

(71) Applicant: KIOXIA CORPORATION, Tokyo (JP)

(72) Inventors: Kenji Funaoka, Kawasaki Kanagawa (JP); Takuya Haga, Yokohama Kanagawa (JP); Toru Katagiri, Sagamihara Kanagawa (JP); Konosuke Watanabe, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/935,593

(22) Filed: Jul. 22, 2020

(65) Prior Publication Data

US 2020/0350929 A1 Nov. 5, 2020

Related U.S. Application Data

(62) Division of application No. 15/909,678, filed on Mar. 1, 2018, now Pat. No. 10,763,897.

(30) Foreign Application Priority Data

Sep. 20, 2017 (JP) .............................. JP2017-180350

(51) Int. Cl.
*H03M 13/35* (2006.01)
*H03M 13/37* (2006.01)
(Continued)

(52) U.S. Cl.
CPC ....... *H03M 13/356* (2013.01); *G06F 11/1048* (2013.01); *G06F 11/1068* (2013.01);
(Continued)

(58) Field of Classification Search
CPC .. H03M 13/356; H03M 13/3715; G11C 29/52
See application file for complete search history.

(56) References Cited

U.S. PATENT DOCUMENTS 5,511,079 A    4/1996  Dillon
5,579,303 A *  11/1996 Kiriyama .............. H04L 1/0083
                                                   370/17
(Continued)

FOREIGN PATENT DOCUMENTS

JP    2004-152194 A    5/2004
JP    2004-215224 A    7/2004
(Continued)

OTHER PUBLICATIONS

R. W. Hamming, Error Detecting and Error Correcting Codes, The Bell System Technical Journal, Apr. 1950, 147-160, vol. XXIX, No. 2, American Telephone and Telegraph Company.
(Continued)

*Primary Examiner* — Joseph D Torres
(74) *Attorney, Agent, or Firm* — Kim & Stewart LLP

(57) ABSTRACT

A memory system, which is connectable to a host, includes a non-volatile memory and a controller configured to store data in the non-volatile memory and in a memory region within the host and read the data from the memory region within the host. The controller includes a first encoding/decoding circuit configured to execute encoding/decoding with a first encoding scheme, a second encoding/decoding circuit configured to execute encoding/decoding with a second encoding scheme having a higher error correcting capability than an error correcting capability of the first encoding scheme, an encoding scheme selecting circuit configured to select an encoding/decoding circuit from the first encoding/decoding circuit and the second encoding/decoding circuit to perform encoding of data to be stored in the memory region, based on information about the data read from the memory region.

8 Claims, 9 Drawing Sheets

(51) Int. Cl.
*G11C 29/52* (2006.01)
*G06F 11/10* (2006.01)
*G11C 29/04* (2006.01)

(52) U.S. Cl.
CPC ........... *G11C 29/52* (2013.01); *H03M 13/353* (2013.01); *H03M 13/3715* (2013.01); *G11C 2029/0411* (2013.01)

(56) References Cited

U.S. PATENT DOCUMENTS

| | | | |
|---|---|---|---|
| 5,768,309 | A | 6/1998 | Olafsson |
| 5,856,988 | A | 1/1999 | Kiriyama |
| 5,930,448 | A | 7/1999 | Lee et al. |
| 5,995,517 | A * | 11/1999 | Tomida et al. ........ H04H 40/18 370/486 |
| 6,522,665 | B1 | 2/2003 | Suzuki et al. |
| 7,984,366 | B2 | 7/2011 | Hsu |
| 8,171,380 | B2 | 5/2012 | Yang et al. |
| 8,315,006 | B1 * | 11/2012 | Chahwan et al. ... G11B 19/042 360/75 |
| 8,751,906 | B2 * | 6/2014 | Yeo et al. ............ G11C 16/349 714/774 |
| 9,164,831 | B2 | 10/2015 | Horisaki et al. |
| 10,540,275 | B2 | 1/2020 | Okubo et al. |
| 2003/0005385 | A1 | 1/2003 | Stieger |
| 2003/0115414 | A1 | 6/2003 | Tomita |
| 2008/0117548 | A1 | 5/2008 | Azuma et al. |
| 2009/0241008 | A1 * | 9/2009 | Kim et al. ........ H03M 13/2903 714/755 |
| 2009/0271689 | A1 | 10/2009 | Ikuta et al. |
| 2010/0023672 | A1 * | 1/2010 | Gorobets et al. ... G06F 12/0246 711/103 |
| 2011/0191654 | A1 * | 8/2011 | Rub ...................... H03M 13/05 714/773 |
| 2013/0145231 | A1 * | 6/2013 | Frayer et al. ....... H03M 13/152 714/763 |
| 2015/0309742 | A1 | 10/2015 | Amidi et al. |
| 2017/0293523 | A1 * | 10/2017 | Lunadier ................ G11C 29/52 |

FOREIGN PATENT DOCUMENTS

| | | |
|---|---|---|
| JP | 2004-328434 A | 11/2004 |
| JP | 2006-352491 A | 12/2006 |
| JP | 2008-192054 A | 8/2008 |
| JP | 2009-266345 A | 11/2009 |
| JP | 2013-029882 A | 2/2013 |
| WO | 2016/103851 A1 | 6/2016 |

OTHER PUBLICATIONS

Japanese Notice of Reasons for Refusal dated Sep. 23, 2020, mailed in counterpart Japanese Patent Application No. 2017-180350, 8 pages (with Translation).

* cited by examiner

MEMORY SYSTEM

CROSS-REFERENCE TO RELATED APPLICATIONS

This application is a division of U.S. patent application Ser. No. 15/909,678, filed on Mar. 1, 2018, which is based upon and claims the benefit of priority from Japanese Patent Application No. 2017-180350, filed on Sep. 20, 2017, the entire contents of each of which are incorporated herein by reference.

FIELD

Embodiments described herein relate generally to a memory system.

BACKGROUND

A unified memory architecture (UMA) in which a host and a memory system both use memory mounted in the host is known. In a system to which the UMA is applied, the memory system connected to the host as an external memory device uses part of the memory mounted in the host.

DETAILED DESCRIPTION

Embodiments provide a memory system which is capable of dynamically changing an encoding scheme.

In general, according to one embodiment, a memory system, which is connectable to a host, includes a non-volatile memory and a controller configured to store data in the non-volatile memory and in a memory region within the host and read the data from the memory region within the host. The controller includes a first encoding/decoding circuit configured to execute encoding/decoding with a first encoding scheme, a second encoding/decoding circuit configured to execute encoding/decoding with a second encoding scheme having a higher error correcting capability than an error correcting capability of the first encoding scheme, an encoding scheme selecting circuit configured to select an encoding/decoding circuit from the first encoding/decoding circuit and the second encoding/decoding circuit to perform encoding of data to be stored in the memory region, based on information about the data read from the memory region.

Hereinafter, a memory system according to embodiments will be described in detail with reference to the accompanying drawings. In the meantime, the present disclosure is not limited by the embodiments described below.

First Embodiment

Figure 1:
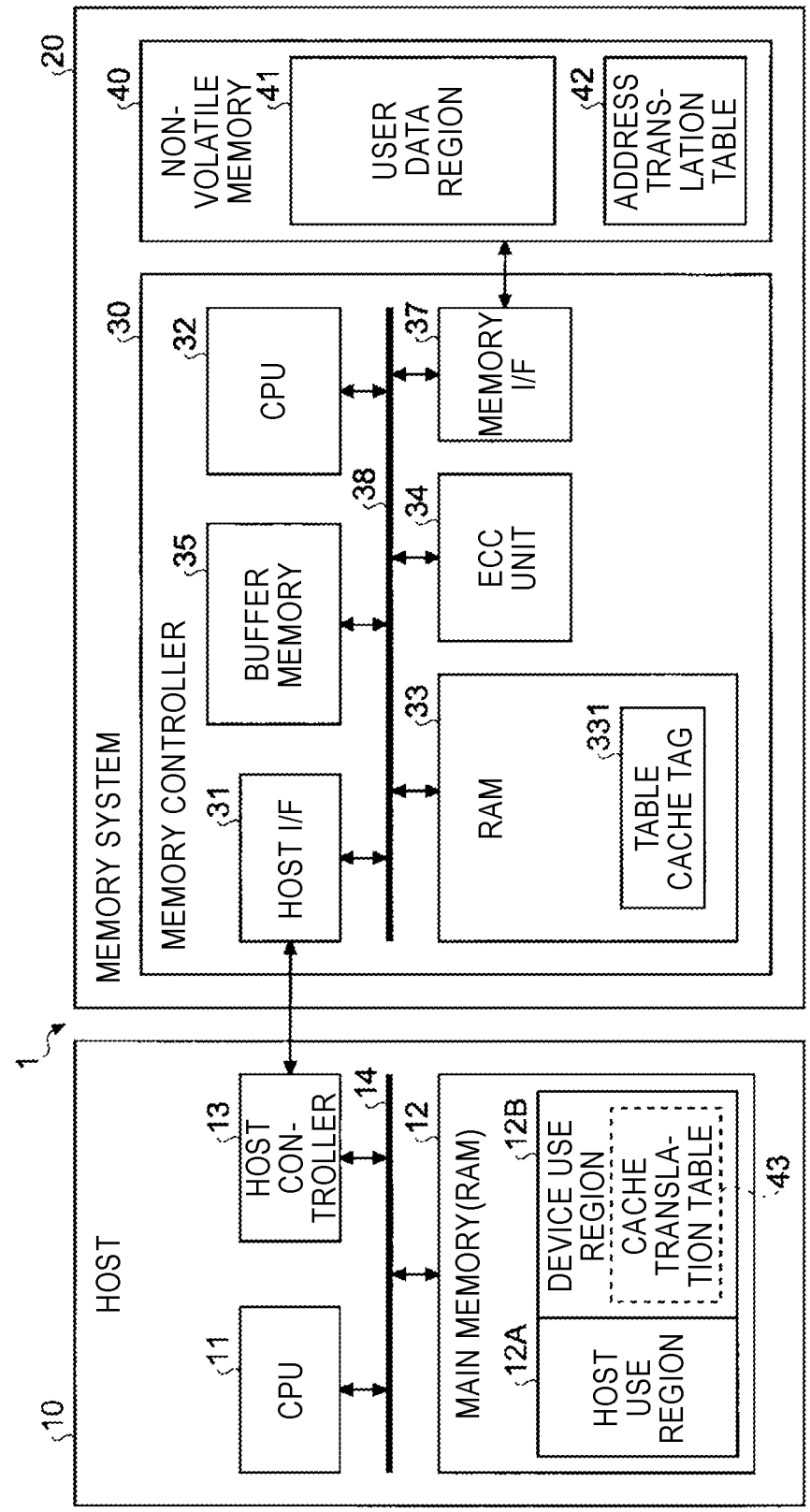
FIG. 1 is a schematic block diagram of a computer system according to a first embodiment.

FIG. 1 is a schematic block diagram of a computer system according to a first embodiment. As illustrated in FIG. 1, a computer system 1 includes a host 10 and a memory system 20 connected as an external memory or storage device to the host 10.

The host 10 is, for example, an electronic device such as a personal computer and a portable terminal. The host 10 may be an imaging device such as a digital still camera and a video camera, and may also be a tablet computer, a smart phone, a gaming device, a car navigation system, a printer device, a scanner device, a server system, or the like.

The memory system 20 may be a device, such as a solid state drive (SSD) and a universal serial bus (USB) memory, connectible to the host 10. The memory system 20 may be inserted into the host 10 or connected to the host 10 through a cable or a network.

The host 10 and the memory system 20 are connected to each other by a predetermined interface standard. The predetermined interface standard may be, for example, a peripheral component interconnect express (PCIe) standard having characteristics such as a wide band, low latency, and high scalability, or a non-volatile memory express (NVMe) standard for accessing a non-volatile memory device having an interface conforming to the PCIe standard. Otherwise, the predetermined interface standard may be a serial advanced technology attachment (SATA) standard, a universal serial bus (USB) standard, a serial attached SCSI (SAS) standard, a mobile industry processor interface (MIPI) standard, a unified protocol (UniPro) standard, a universal flash storage (UFS) standard, or the like.

The host 10 includes a central processing unit (CPU) (hereinafter, also referred to as a "host CPU") 11, a main memory 12, a host controller 13, and a bus 14 which connects the CPU 11, the main memory 12, and the host controller 13 with one another.

The CPU 11 is a processor that controls the components within the host 10. The CPU 11 executes, for example, a program loaded from the memory system 20 to the main memory 12. The program includes, for example, an operating system, a file system, and an application program.

The main memory 12 is, for example, a random access memory. The main memory 12 may be a volatile memory such as a dynamic random access memory (DRAM), or a non-volatile memory such as a magnetic random access memory (MRAM) and a ferroelectric random access memory (FeRAM).

The main memory 12 has a host use region 12A and a device use region 12B. The host use region 12A is used as a program development region when the host 10 executes, for example, an operating system (OS) or a user program, or as a working region when a program loaded into the program development region is executed.

The device use region 12B is a region usable by the memory system 20, and may also be called a host memory buffer, a unified memory (UM), or the like. A size of the device use region 12B is generally determined by the host 10, but may be changed. For example, the OS of the host 10 may determine the size of the device use region 12B according to needs of the memory system 20.

For example, the CPU 11 or the host controller 13 in the host 10 stores an address translation table 42 representing a relationship between a logical address and a physical address received from the memory system 20, in the device use region 12B as cache data. Herein, the logical address is an address in a logical address space managed by the host 10, and the physical address is an address in a physical address space in a non-volatile memory 40. Further, data to be stored in the device use region 12B is not limited to the address translation table 42, and may be various data such as, for example, firmware or various tables executed by a CPU 32. Further, the purpose and usage of the device use region 12B by the memory system 20 is not limited to the cache of data. That is, the memory system 20 may use the device use region 12B of the main memory 12 of the host 10 for various other purposes.

When the address translation table 42 is stored in the device use region 12B, the size of the device use region 12B may be larger than the size of a RAM 33 within the memory system 20. This configuration may achieve the advantages described below.

The first advantage is that the memory system 20 may be implemented at low cost. Recently, as the non-volatile memory 40 within the memory system 20 has increased in capacity due to, for example, the use of three-dimensional memory cell arrays, and a size of a user data region 41 storing user data has increased along with that, the size of the address translation table 42 which translates a logical address managed by the host 10 into a physical address in the non-volatile memory 40 has also increased.

In the meantime, in order to perform a read/write operation at a high speed, it is necessary to translate a logical address into a physical address at a high speed, and to achieve this, there is a method of reading the address translation table 42 as cache data, for example, in the RAM 33 within the memory system 20. However, as described above, the size of the address translation table 42 is large, so that when the entire address translation table 42 is stored in the RAM 33, the RAM 33 having a large capacity is required. This means that cost of the memory system 20 is increased.

Therefore, when an entire or a part of the address translation table 42 is stored in the device use region 12B as cache data (e.g., a cache translation table 43) by increasing the size of the device use region 12B to be larger than the size of the RAM 33, the entire or the part of the address translation table 42 may be stored in a memory region that is accessible at a high speed without increasing the size of the RAM 33 within the memory system 20, i.e., in the device use region 12B. As a result, the memory system 20 may be implemented at a low cost.

The second advantage is that access performance of the memory system 20 may be improved. When the address translation table 42 is stored in the RAM 33 within the memory system 20 as cache data, the size of the address translation table 42 which is readable in the RAM 33 as the cache data is limited by the size of capacity of the RAM 33. That is, only a part of the address translation table 42 is stored in the RAM 33 as cache data, so that the access performance of the memory system 20 can be improved without increasing the size of the RAM 33.

In this case, an access speed may be decreased according to a cache hit rate in the RAM 33. Further, for example, when there is a cache miss, the address translation table 42 first needs to be read from the non-volatile memory 40, and then, an address translation from a logical address into a physical address is performed. As a result, an access operation (e.g., read operation) needs to be initiated. This causes deterioration in the performance of the access to the non-volatile memory 40. That is, this means that the access speed is decreased.

Therefore, when the size of the device use region 12B is increased to be larger than the size of the RAM 33, the size of the address translation table 42 readable in the device use region 12B may be further increased. For example, the entire address translation table 42 may be stored in the device use region 12B as the cache translation table 43. Accordingly, the cache hit rate in the cache translation table 43 is improved, thereby improving the performance of the non-volatile memory 40.

The host controller 13 is a controller for performing data communication between the host 10 and the memory system 20. For example, the host controller 13 issues a write command or a read command to the memory system 20. Further, the host controller 13 receives a read/write request for read/write of data within the device use region 12B from the memory system 20.

The memory system 20 includes a memory controller 30 and the non-volatile memory 40. The non-volatile memory 40 is a storage memory of which capacity may be increased, for example, a NAND-type flash memory. The non-volatile memory 40 may have a memory cell array of a two-dimensional structure or a memory cell array of a three-dimensional structure. The non-volatile memory 40 may include a plurality of stacked memory chips.

The non-volatile memory 40 has the user data region 41 storing user data. Further, the non-volatile memory 40 may store the address translation table 42 representing a relationship between a logical address and a physical address.

For example, the memory controller 30 reads an entire or a part of the address translation table 42 from the non-volatile memory 40 and transmits the entire or part of the address translation table 42 to the host 10 through a host interface (I/F) 31. The host controller 13 stores the entire or a part of the address translation table 42 as the cache translation table 43 in the device use region 12B according to an instruction from the memory controller 30. A sequence in which the memory controller 30 executes the read/write operation of the device use region 12B may comply with, for example, the standard for universal flash storage unified memory extension.

The memory controller 30 includes, for example, the host I/F 31, the CPU 32, the RAM 33, an error correction code (ECC) unit 34, a buffer memory 35, a memory interface (I/F) 37, and an internal bus 38 connecting the host I/F 31, the CPU 32, the RAM 33, the ECC unit 34, the buffer memory 35, and the memory I/F 37 with one another.

The host I/F 31 receives various commands, such as a read/write command, from the host 10. Further, the host I/F 31 may transmit an access command to the device use region 12B (e.g., read or write command), to the host 10.

The RAM 33 is a device-embedded RAM that is installed within the memory system 20. The RAM 33 is installed within the memory controller 30, but instead of this, the RAM 33 may be external to the memory controller 30. The RAM 33 may be a volatile RAM such as a DRAM and a static random access memory (SRAM). The RAM 33 is used as a working region of the CPU 32, and stores various data such as loaded firmware or various tables.

The RAM stores, for example, a table cache tag 331. The table cache tag 331 is, for example, tag information that manages the cache translation table 43 stored in the device use region 12B. That is, the table cache tag 331 is used for determining hit/miss representing whether the cache translation table 43 that translates a logical address into a physical address exists in the device use region 12B, at the time of the access to the non-volatile memory 40.

As described above, the table cache tag 331 is stored in the RAM 33 within the memory controller 30, rather than in the device use region 12B. The reason is that when the CPU 32 refers to the table cache tag 331 within the RAM 33, the hit/miss may be immediately determined without accessing the device use region 12B. However, when the entire address translation table 42 is cached in the device use region 12B at the side of the host 10, the table cache tag 331 within the RAM 33 may be omitted.

When data is written in the non-volatile memory 40, the ECC unit 34 protects the write data by an error correction code by performing ECC encoding on the written data. Further, when data is read from the non-volatile memory 40, the ECC unit 34 executes an error correction of the read data by performing ECC decoding on the ECC encoded data read from the non-volatile memory 40.

The memory I/F 37 serves as an interface when the write/read is performed with respect to the non-volatile memory 40.

The CPU 32 controls an operation of each unit within the memory controller 30 by, for example, reading and executing the firmware stored in the RAM 33.

Figure 2:
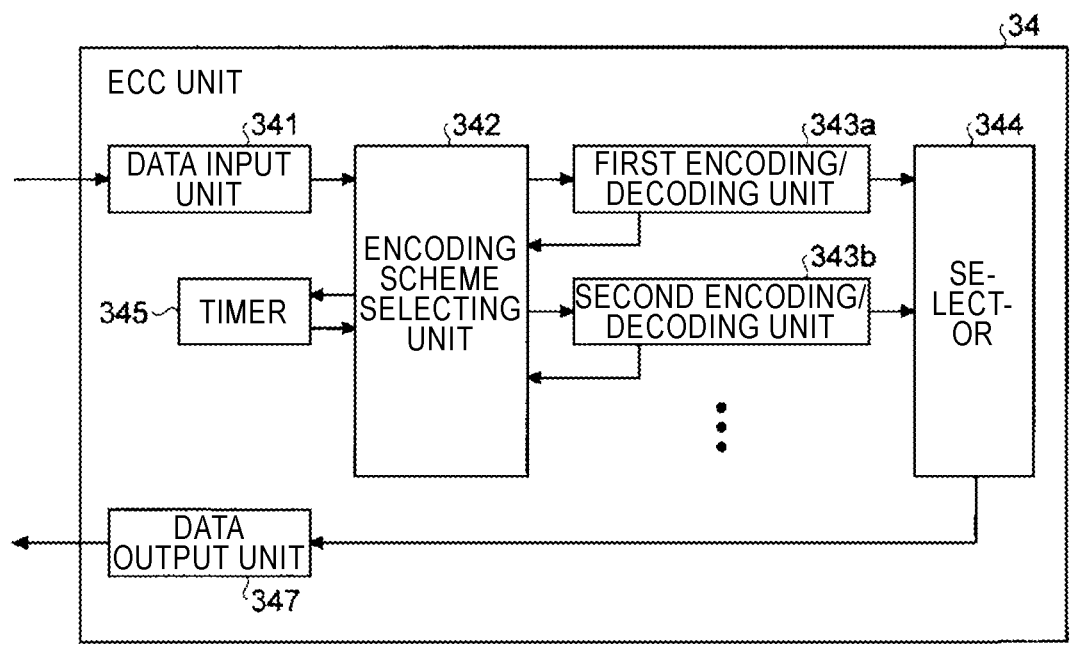
FIG. 2 is a detailed block diagram of an error correction code (ECC) unit of the first embodiment.

In the foregoing configuration, when the memory system 20 uses the device use region 12B of the main memory 12 of the host 10, the memory system 20 encodes the data to be cached in the device use region 12B by using the ECC unit 34 in order to prevent destruction due to, for example, an intentional alteration or a bit variant. FIG. 2 is a block diagram illustrating a more detailed configuration of the ECC unit according to the present embodiment.

In one embodiment, the ECC unit 34 is implemented as a circuit. As illustrated in FIG. 2, the ECC unit 34 includes the following sub-circuits of the ECC unit 34: an encoding scheme selecting unit 342, a plurality of encoding/decoding units 343 (including a first encoding/decoding unit 343a, a second encoding/decoding unit 343b, . . . ), a selector 344, a timer 345, a data input unit 341, and a data output unit 347.

The encoding/decoding units 343 execute encoding or decoding on input data. The encoding/decoding units 343 implement encoding schemes having different error correcting capabilities, respectively. For example, an error correcting capability by the encoding scheme implemented in the first encoding/decoding unit 343a is lower than an error correcting capability by the encoding scheme implemented in the second encoding/decoding unit 343b. However, when one encoding/decoding unit is capable of executing encoding and decoding having different error correction capabilities, the encoding/decoding units may be combined into one encoding/decoding unit. Further, in the present embodiment, even though three or more encoding/decoding units are provided, there may be a case where two or more encoding/decoding units implement the same encoding scheme.

Herein, low error correcting capability refers to a case where the number of correctable error bits (hereinafter referred to as the correctable number) for data that is a decoding target is 0 (e.g., a case where only the error detection is possible) or a relatively small number (e.g., the correctable number is 1). Meanwhile, high error correcting capability refers to a case where the number of correctable error bits for data that is a decoding target is a relatively large number (for example, the correctable number is 2 or more). In general, when the error correcting capability is low, a redundant part (parity and the like) added to the data is small, and an encoding ratio is kept to be low, so that usage efficiency of the memory (for example, an actual memory capacity for user data) is high. In the meantime, when the error correcting capability is high, a redundant part (parity and the like) added to the data is large, and an encoding ratio increases, so that usage efficiency of the memory is low. Therefore, in the present embodiment, reliability of the data cached in the device use region 12B is secured, and use efficiency of the device use region 12B is increased, by selecting an encoding scheme (or error correcting capability) to be used according to one or more factors described below.

The encoding scheme selecting unit 342 selects an encoding scheme to be used according to one or more factors. The encoding scheme selecting unit 342 obtains information (hereinafter, referred to as "error information") for evaluating reliability for the device use region 12B within the host 10, and determines an encoding scheme for the data to be cached in the device use region 12B based on the obtained error information. Specifically, for example, the encoding scheme selecting unit 342 determines any one of the encoding/decoding units 343 as an output destination of the data (encoding data or decoding data) input from the data input unit 341 based on the error information obtained from the encoding/decoding units 343.

Herein, the error information may be, for example, information representing whether the encoding/decoding units 343 detect a bit error for the data read from the device use region 12B. However, the error information is not limited thereto. The error information may be any other information as long as the information may be used to evaluate the degree of deterioration (hereinafter, referred to as a "degree of fatigue") in the reliability (e.g., the data holding characteristic) of the device use region 12B, and may include, for example, the number of error bits or a bit error rate (BER) specified in the error detecting/correcting processing (hereinafter, referred to as an "ECC processing") performed by the encoding/decoding units 343, on the data read from the device use region 12B, or the number of times of program erase of each block configuring the region such as the device use region 12B. The encoding scheme selecting unit 342 may use various information as the error information.

In the present embodiment, the error information refers to one error information for the entire device use region 12B. However, the error information is not limited thereto. For example, when the device use region 12B is divided into a plurality of regions, the error information may refer to error information for each region, and when the data cached in the device use region 12B is divided into data in the unit of write or read, the error information may refer to error information for each data of the unit.

As a decoding scheme for the data read from the device use region 12B, the encoding scheme selecting unit 342 selects a decoding scheme corresponding to the encoding scheme used when the corresponding data is encoded. That is, the encoding scheme selecting unit 342 stores the encoding/decoding unit used when the data read from the device use region 12B is encoded, and selects the stored encoding/decoding unit as an input destination upon decoding of the data.

As the encoding scheme of each of the encoding/decoding units 343, an encryption scheme such as an advanced encryption standard (AES), an error correction code such as a Hamming code, cyclic redundancy check (CRC)-32, or other various encoding schemes may be adopted. In the present description, encryption and a code capable of detecting a bit error (or an error bit) will be collectively referred to as an "error detection code," and a code capable of correcting an error will be referred to as an "error correction code." In the meantime, the error correction code also includes a code capable of detecting an error even when an error correction is impossible. Further, in general error correction, the error detection is also performed in the process of correcting an error bit or the like. Thus, in the present description, when a bit error or the like is detected in the error correcting process, it may also be said that "an error is detected."

The timer 345 is a timer measuring a time elapsed from a specific timing, and for example, the timer 345 measures an elapsed time when it is determined whether a bit error is detected for the data read from the device use region 12B within a specific time.

The selector 344 outputs the encoded data (hereinafter, referred to as "encoded data" or "encoded word") output from one of the encoding/decoding units 343, or the decoded data (hereinafter, referred to as "decoded data" or "decoded word") output from one of the encoding/decoding units 343.

The data input unit 341 inputs encoding target data or decoding target data from the RAM 33 and the like through the internal bus 38. The data output unit 347 outputs the encoded data or the decoded data output from the selector 344 to the RAM 33 and the like through the internal bus 38.

Figure 3:
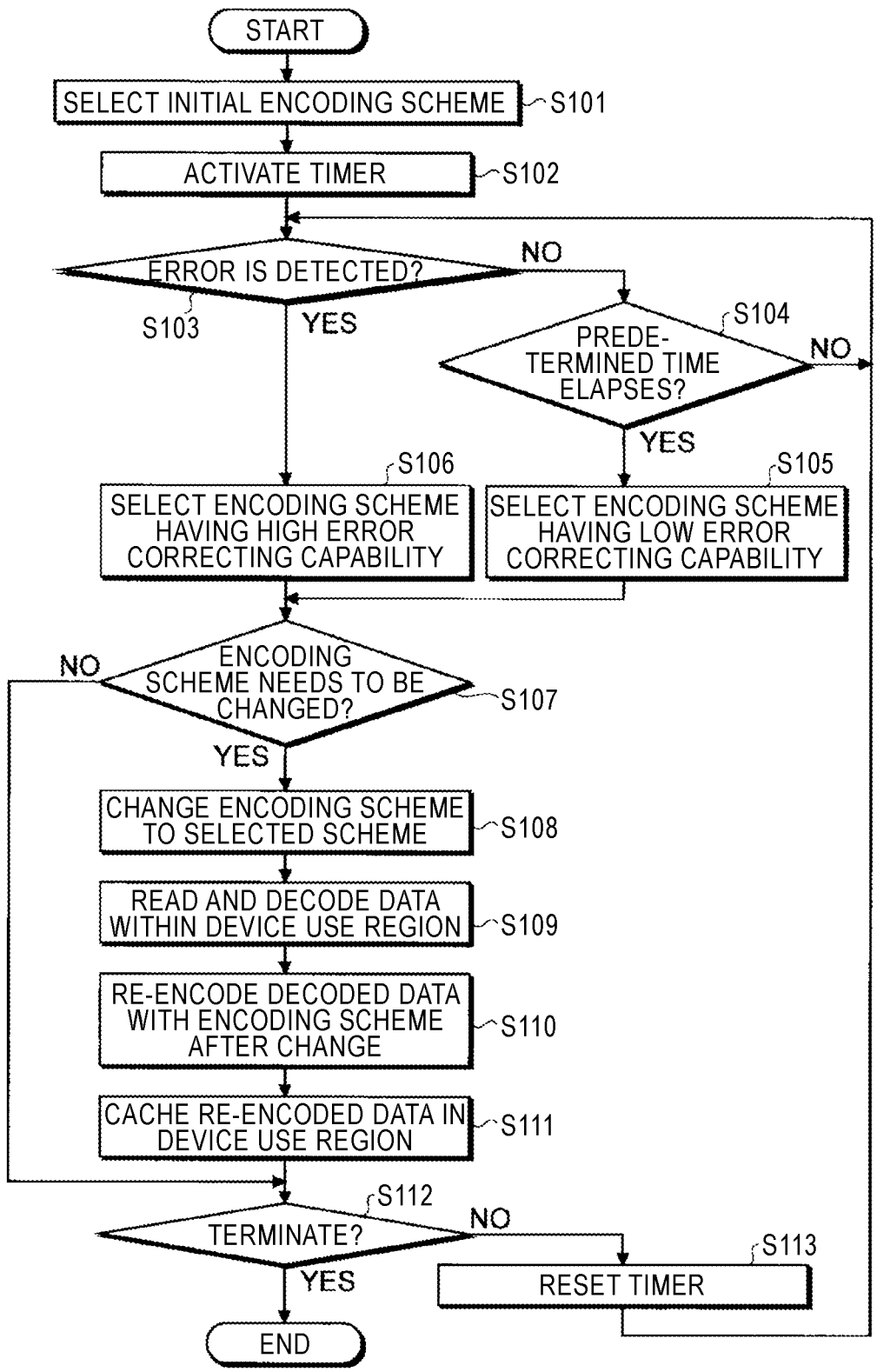
FIG. 3 is a flowchart illustrating an example of an encoding scheme determining operation of the first embodiment.

Subsequently, the operation performed when the encoding scheme selecting unit 342 of the ECC unit 34 determines an encoding scheme for data to be cached in the device use region 12B according to the present embodiment will be described in detail with reference to the drawings. FIG. 3 is a flowchart illustrating an example of an encoding scheme determining operation according to the present embodiment. Further, for simplification, the present description assumes an example where the encoding scheme selecting unit 342 selects an encoding/decoding unit to be used from two encoding/decoding units including the first encoding/decoding unit 343a and the second encoding/decoding unit 343b, and the encoding scheme implemented in the first encoding/decoding unit 343a has lower error correcting capability than the encoding scheme implemented in the second encoding/decoding unit 343b.

As illustrated in FIG. 3, in the present operation, for example, when the ECC unit 34 is activated based on an instruction from the CPU 32, the encoding scheme selecting unit 342 first selects an encoding scheme to be used in the initial state, that is, an encoding/decoding unit which encodes/decodes data to be cached in the device use region 12B (step S101). In the present description, the encoding/decoding unit that is an input destination of the data in the initial state is the second encoding/decoding unit 343b. However, the present disclosure is not limited thereto, and the encoding/decoding unit that is an input destination of the data in the initial state may be the first encoding/decoding unit 343a. Otherwise, an encoding/decoding unit used at the initial time may also be determined according to a size of the device use region 12B given by the host 10. For example, when a size of the device use region 12B is relatively large, the second encoding/decoding unit 343b having a high encoding ratio may be used at the initial time, and when a size of the device use region 12B is relatively small, the first encoding/decoding unit 343a having a low encoding ratio may be used at the initial time.

Next, the encoding scheme selecting unit 342 activates the timer 345 to start a measurement of an elapsed time (step S102), and it is determined whether the first encoding/decoding unit 343a or the second encoding/decoding unit 343b detects an error for the data read from the device use region 12B until a predetermined time elapses ("YES" in step S104) (step S103).

When it is determined that the error is detected before the predetermined time elapses ("NO" in step S104 and "YES" in step S103), the encoding scheme selecting unit 342 selects an encoding scheme having a high error correcting capability, that is, the second encoding/decoding unit 343b having a high error correcting capability, as an input destination of the data to be cached in the device use region 12B (step S106), and then, the encoding scheme selecting unit 342 proceeds to step S107.

In the meantime, when it is determined that the error is not detected within the predetermined time ("NO" in step S103 and "YES" in step S104), the encoding scheme selecting unit 342 selects an encoding scheme having a low error correcting capability, that is, the first encoding/decoding unit 343a having a low error correcting capability, as an input destination of the data cached in the device use region 12B (step S105), and then, the encoding scheme selecting unit 342 proceeds to step S107.

In step S107, the encoding scheme selecting unit 342 compares the currently selected encoding scheme with the encoding scheme selected in step S105 or S106, and determines whether it is necessary to change the encoding scheme. That is, in step S107, the encoding scheme selecting unit 342 compares the current input destination of the data to be cached in the device use region 12B with the new input destination selected in step S105 or S106, and determines whether it is necessary to change the input destination. When it is determined that it is not necessary to change the input destination ("NO" in step S107), the encoding scheme selecting unit 342 proceeds to step S112.

In the meantime, when it is determined that it is necessary to change the input destination ("YES" in step S107), the encoding scheme selecting unit 342 changes the input destination of the data to be cached in the device use region 12B to the input destination selected by step S105 or S106 (step S108). Next, the encoding scheme selecting unit 342 reads and decodes the data cached in the device use region 12B (step S109), and subsequently, re-encodes the decoded data by the encoder/decoder (the first encoding/decoding unit 343a or the second encoding/decoding unit 343b) having the encoding scheme changed in step S108 (step S110). Then, the encoding scheme selecting unit 342 caches the encoded data obtained by the re-encoding in the device use region 12B (step S111) and proceeds to step S112.

In step S112, the encoding scheme selecting unit 342 determines whether to terminate the present operation, and when it is determined to terminate the present operation ("YES" in step S112), the encoding scheme selecting unit 342 terminates the present operation. In the meantime, when it is determined not to terminate the present operation ("NO" in step S112), the encoding scheme selecting unit 342 resets the timer 345 (step S113), and then, returns to step S103 to execute the subsequent operations.

As described above, in the present embodiment, the encoding scheme of the data to be cached in the device use region 12B is determined based on whether an error is detected in the data read from the device use region 12B within the predetermined time. Accordingly, according to the present embodiment, an encoding scheme (or an error correcting capability) to be used may be selected based on a situation on whether a bit error occurs or a situation on whether a bit error easily occurs, so that use efficiency of the device use region 12B may be improved while securing reliability of the data cached in the device use region 12B.

In the present embodiment, the case where when the encoding scheme is changed, all of the data cached in the device use region 12B is first read, decoded, re-encoded, and then, written in the device use region 12B again is given as an example, but the present disclosure is not limited thereto. For example, when the device use region 12B is divided into a plurality of regions (e.g., divided into regions each serving as a unit of write/read), the cache data may be sequentially read from each region according to an operation situation of the ECC unit 34 and the like of the memory controller 30 to be decoded, re-encoded, and written in the device use region 12B again. Otherwise, data in which the error is detected may be a target to be decoded, re-encoded, and written in the device use region 12B again. Further, data in which the error is detected but is not correctable may be deleted.

Figure 4:
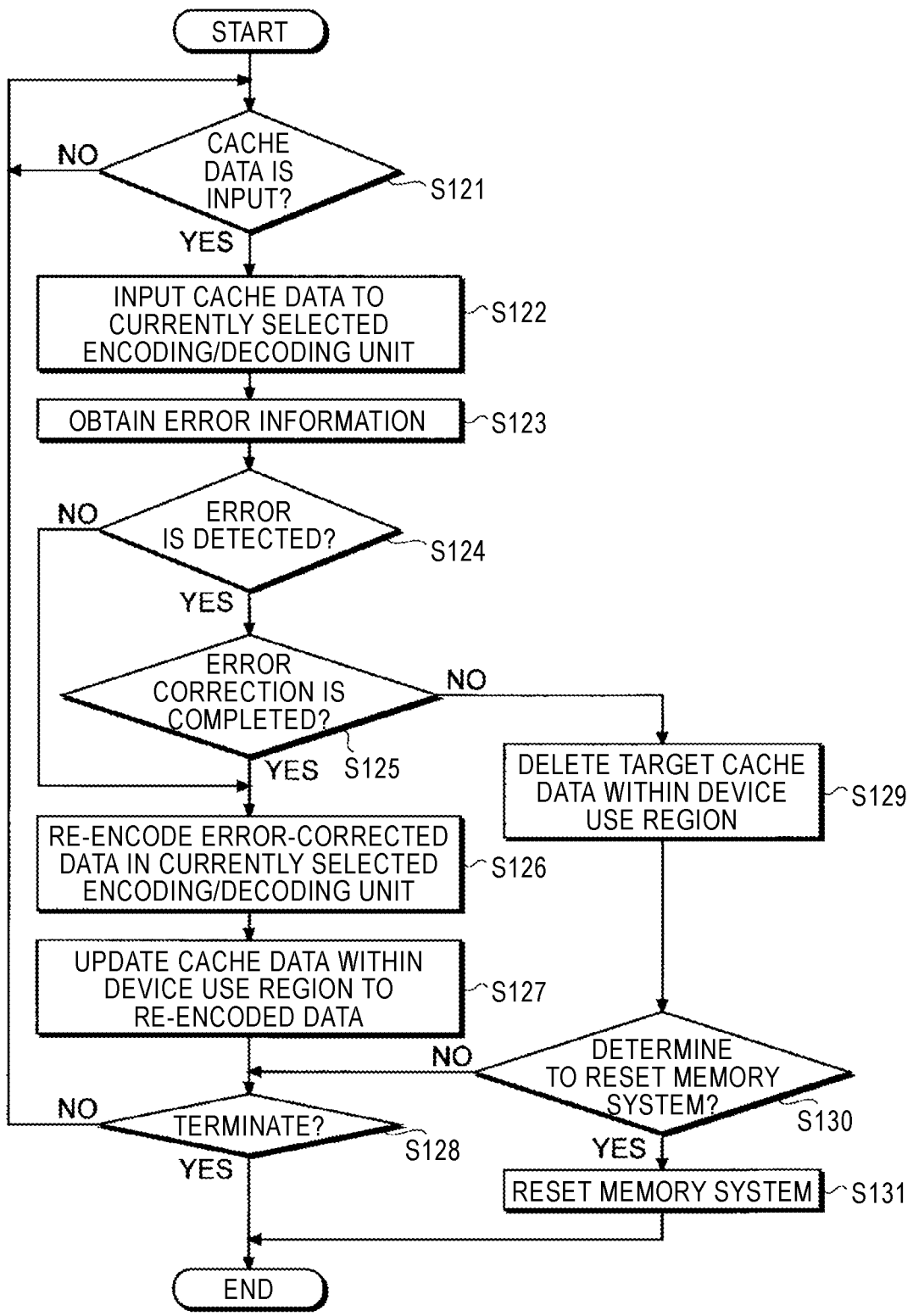
FIG. 4 is a flowchart illustrating an example of an operation when decoding is performed in the first embodiment.

Next, an operation performed by the ECC unit 34 according to the present embodiment upon decoding will be described in detail with reference to the drawing. FIG. 4 is a flowchart illustrating an example of an operation upon decoding according to the present embodiment. Further, for simplification, the present description assumes an example where the encoding scheme selecting unit 342 selects an encoding/decoding unit to be used from the two encoding/decoding units including the first encoding/decoding unit 343a and the second encoding/decoding unit 343b, and the encoding scheme adopted for the first encoding/decoding unit 343a has lower error correcting capability than the encoding scheme adopted for the second encoding/decoding unit 343b.

As illustrated in FIG. 4, when the encoding scheme selecting unit 342 receives cache data read from the device use region 12B based on, for example, an instruction by the CPU 32 after activation ("YES" in step S121), the encoding scheme selecting unit 342 inputs the input cache data to an encoding/decoding unit (the first encoding/decoding unit 343a or the second encoding/decoding unit 343b) corresponding to the currently selected encoding scheme (step S122). In this case, the first encoding/decoding unit 343a or the second encoding/decoding unit 343b to which the cache data is input decodes the input cache data and outputs a result of the decoding to the selector 344, and when an error is detected by the decoding, the first encoding/decoding unit 343a or the second encoding/decoding unit 343b notifies the encoding scheme selecting unit 342 of information indicating that the error is detected or a result of the decoding as error information.

When the encoding scheme selecting unit 342 obtains the error information from the currently selected first encoding/decoding unit 343a or second encoding/decoding unit 343b (step S123), the encoding scheme selecting unit 342 determines whether an error is detected during the decoding (step S124). When it is determined that the error is not detected ("NO" in step S124), the encoding scheme selecting unit 342 proceeds to step S126. In the meantime, when it is determined that the error is detected ("YES" in step S124), the encoding scheme selecting unit 342 determines whether the error correction is completed based on the obtained error information (step S125), and when it is determined that the error correction is completed ("YES" in step S125), the encoding scheme selecting unit 342 proceeds to step S126. In the meantime, when it is determined that the error correction is not completed, that is, the detected error is uncorrectable ("NO" in step S125), the encoding scheme selecting unit 342 proceeds to step S129.

In step S126, the encoding scheme selecting unit 342 inputs the data after the error correction, which is output from the data output unit 347 through the selector 344 and is temporarily maintained in the buffer memory 35 and the like, for example, for the CPU 32, to the currently selected encoding/decoding unit (the first encoding/decoding unit 343a or the second encoding/decoding unit 343b) and re-encodes the data. Subsequently, the encoding scheme selecting unit 342 instructs the CPU 32 to update the cache data within the device use region 12B with the re-encoded data (step S127) and proceeds to step S128.

In step S129, the encoding scheme selecting unit 342 instructs the CPU 32 to delete the cache data, of which the error is uncorrectable, in the device use region 12B (step S129), and then, determines whether to reset the memory system 20 to an initial state (step S130). When it is determined to reset the memory system 20 ("YES" in step S130), the encoding scheme selecting unit 342 requests the reset of the memory system 20 from the CPU 32 (step S131), and then, terminates the present operation for now. In the meantime, when it is determined not to reset the memory system 20 ("NO" in step S130), the encoding scheme selecting unit 342 proceeds to step S128.

In step S128, the encoding scheme selecting unit 342 determines whether to terminate the present operation, and when it is determined to terminate the present operation ("YES" in step S128), the encoding scheme selecting unit 342 terminates the present operation. In the meantime, when it is determined not to terminate the present operation ("NO" in step S128), the encoding scheme selecting unit 342 returns to step S121 and executes the subsequent operations.

As described above, even in the case where the error bit is included in the cache data read from the device use region 12B, when the error bit is correctable, the cache data within the device use region 12B may be updated to the data after the error correction. Accordingly, the cache data within the device use region 12B may be recovered, thereby improving reliability and implementing a more stable operation.

As described above, in the present embodiment, in order to prevent the data, such as the address translation table 42, cached in the device use region 12B prepared at the side of the host 10 from being destroyed due to an intentional alteration or a bit variant, an encoding scheme (or an error correcting capability) to be used may be selected according to a situation when the data is protected by the error correction code, thereby securing reliability of the data cached in the device use region 12B and improving use efficiency of the device use region 12B.

In the first embodiment described above, the case where the encoding scheme (or the error correcting capability) to be used is changed based on a situation on whether a bit error occurs or a situation on whether a bit error easily occurs is given as an example, but the present disclosure is not limited thereto. For example, the encoding scheme (or the error correcting capability) to be used may be changed based on significance of the data cached in the device use region 12B. That is, for the data having high significance, the encoding scheme (for example, corresponding to the second encoding/decoding unit 343b) having a high error correcting capability may be used, and for the data having low significance, the encoding scheme (for example, corresponding to the first encoding/decoding unit 343a) having a low error correcting capability may be used. Further, the data having high significance may correspond to the address translation table 42 and the like. Further, the significance of the data may be determined and managed by the encoding scheme selecting unit 342 based on, for example, attribute information of the data, or a user may appropriately set the significance of the data through the host 10 and the encoding scheme selecting unit 342 may manage the set significance of the data.

In the first embodiment described above, the case where when the bit error is not detected within the predetermined time, the data to be cached in the device use region 12B is encoded by the encoding scheme (corresponding to the first encoding/decoding unit 343a) having the low error correcting capability is given as an example, but the present disclosure is not limited thereto. For example, when reliability of the data read from the device use region 12B is high, such as the case where the bit error is not detected within the predetermined time, the data may be cached in the device use region 12B without encoding. Further, in the present description, the description "reliability of the data is high" may be defined to indicate the case where the error bit is not detected in the data within a predetermined time or during the read of the data by the predetermined number of times, or the case where a value of the number of error bits or the bit error rate (BER) specified in the ECC processing performed on the data, or the number of times of the program/erase of each block configuring the region such as the device use region 12B, is smaller than a predetermined threshold value. However, the description is not limited to the definition, and when correctness of the data is sufficient, the data may be considered to have high reliability. The threshold value for determining the high or low reliability of the data may be, for example, a value pre-set by the memory controller 30 or a value which a user may randomly set for the memory system 20 by using the host 10. Further, the threshold value may be dynamically changed by the memory controller 30 during the operation of the memory system 20.

In the present description, in the determination of whether the number of correctable error bits of the encoding scheme adopted in each of the first encoding/decoding unit 343a, the second encoding/decoding unit 343b, . . . , is relatively large or small, when the number of correctable error bits is equal to or larger than a predetermined number, it may be determined that the number of correctable error bits is relatively large, and when the number of correctable error bits is less than the predetermined number or another predetermined number, it may be determined that the number of correctable error bits is relatively small. Further, a main agent of the determination may be the encoding scheme selecting unit 342, a designer of the memory system 20 including the ECC 34, or a user using the memory system 20. When the main agent of the determination is the designer, the ECC unit 34 including the encoding scheme selecting unit 342 is designed based on a result of the determination. Further, when the main agent of the determination is the user, a result of the determination is set in the encoding scheme selecting unit 342, and the encoding scheme selecting unit 342 is operated based on the registered result of the determination.

Whether the size of the device use region 12B is relatively large or small may be appropriately determined according to the purpose of the use (for example, the type or size of the data to be stored and the like) of the device use region 12B, the size of the device use region 12B, or the like. Further, a main agent of the determination may be the CPU 32 or the encoding scheme selecting unit 342, a designer of the memory system 20 including the ECC 34, or a user using the memory system 20. When the main agent of the determination is the designer, the ECC unit 34 including the encoding scheme selecting unit 342 is designed based on a result of the determination. Further, when the main agent of the determination is the user, a result of the determination is set in the encoding scheme selecting unit 342, and the encoding scheme selecting unit 342 is operated based on the registered result of the determination.

Second Embodiment

Next, a memory system according to a second embodiment will be described in detail with reference to the drawings. In the first embodiment, the case where the encoding scheme is selected based on whether an error is detected within the predetermined time to secure reliability of the data cached in the UM region at the side of the host 10 and improve use efficiency of the UM region is given as an example. In regards to this, in the preset embodiment, the case where an encoding scheme is selected based on the number of error bits detected by decoding once to secure reliability of data cached in the UM region at the side of the host 10 and improve use efficiency of the UM region will be described based on an example.

Since a configuration of a computer system including a memory system according to the present embodiment may be the same as the computer system 1 described with reference to FIG. 1 in the first embodiment, detailed description thereof will be omitted herein. Further, since a configuration of an ECC unit according to the present embodiment may also be the same as the ECC unit 34 described with reference to FIG. 2 in the first embodiment, a detailed description thereof will be omitted herein. However, in the present embodiment, the timer 345 in the ECC unit 34 illustrated in FIG. 2 may be omitted. Further, in the present embodiment, an encoding scheme determining operation performed by an encoding scheme selecting unit 342 is an encoding scheme determining operation illustrated in FIG. 5.

Figure 5:
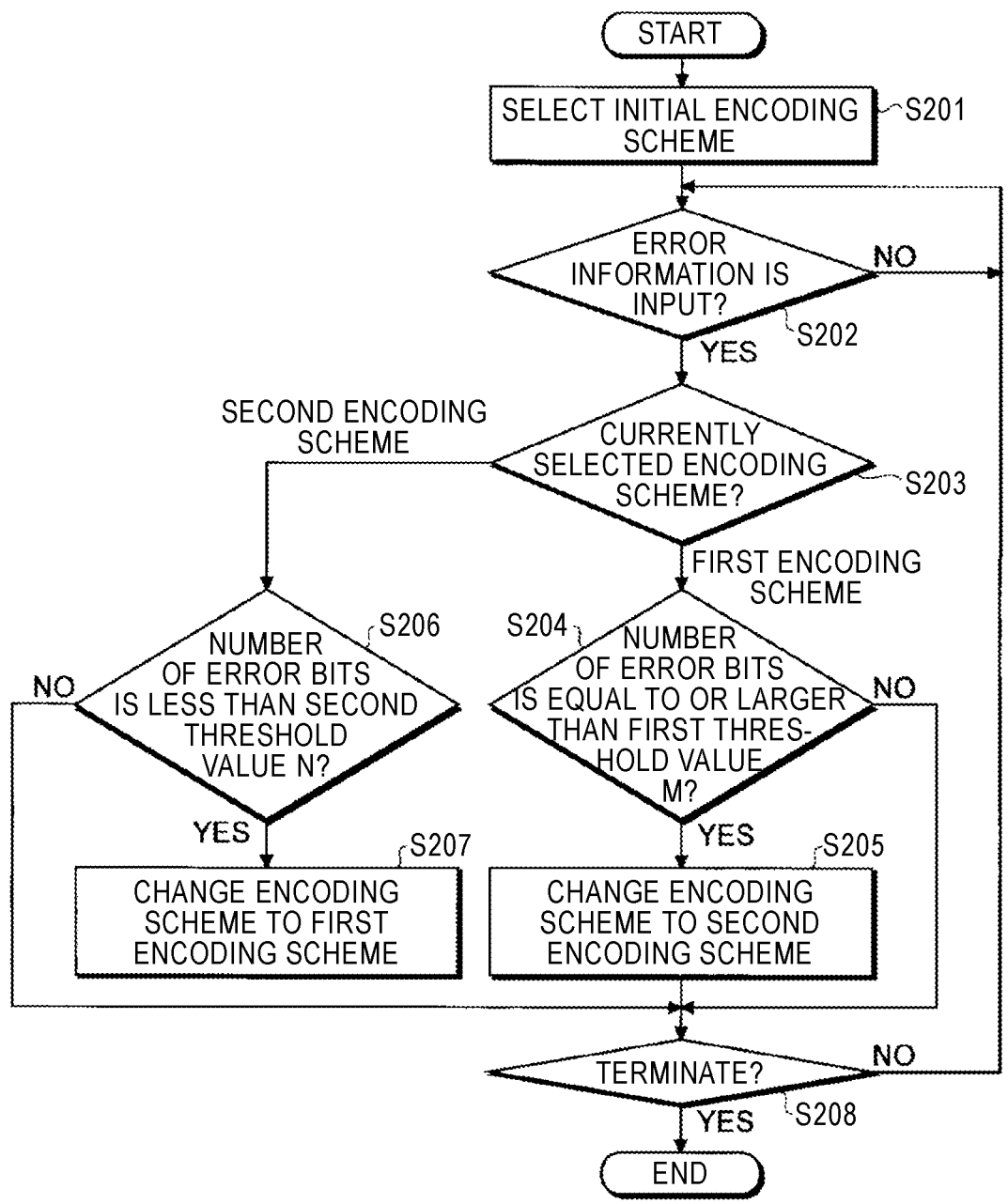
FIG. 5 is a flowchart illustrating an example of an encoding scheme determining operation of a second embodiment.

As illustrated in FIG. 5, in the encoding scheme determining operation according to the second embodiment, for example, when the ECC unit 34 is activated based on an instruction from the CPU 32, first, the encoding scheme selecting unit 342 selects an encoding scheme to be used in the initial state, that is, an encoding/decoding unit which encodes/decodes data to be cached in the device use region 12B (step S201), as in step S101 of FIG. 3.

Next, the encoding scheme selecting unit 342 stands by until error information is input from a currently selected first encoding/decoding unit 343a or second encoding/decoding unit 343b ("NO" in step S202). Further, in the present embodiment, the error information input to the encoding scheme selecting unit 342 from the first encoding/decoding unit 343a or the second encoding/decoding unit 343b includes the number of detected error bits.

When the error information is input from the currently selected first encoding/decoding unit 343a or second encoding/decoding unit 343b ("YES" in step S202), the encoding scheme selecting unit 342 specifies a currently selected encoding scheme, that is, a currently selected encoding/decoding unit as an input destination of the data (step S203). Further, in the present description, the encoding scheme adopted by the first encoding/decoding unit 343a is referred to as a "first encoding scheme," and the encoding scheme adopted by the second encoding/decoding unit 343b is referred to as a "second encoding scheme."

When the currently selected encoding scheme is the first encoding scheme having a low error correcting capability (the first encoding scheme in step S203), the encoding scheme selecting unit 342 determines whether the number of error bits represented by the error information input in step S202 is equal to or larger than a predetermined first threshold value M (for example, M is 2) (step S204), and when it is determined that the number of error bits is less than the first threshold value M ("NO" in step S204), the encoding scheme selecting unit 342 proceeds to step S208. In the meantime, when it is determined that the number of error bits is equal to or larger than the first threshold value M ("YES" in step S204), the encoding scheme selecting unit 342 changes the encoding scheme to the second encoding scheme having a high error correcting capability (step S205) and the encoding scheme selecting unit 342 proceeds to step S208.

When the currently selected encoding scheme is the second encoding scheme having a high error correcting capability (the second encoding scheme in step S203), the encoding scheme selecting unit 342 determines whether the number of error bits represented by the error information input in step S202 is less than a predetermined second threshold value N (N is equal to or less than M, and for example, N is 2) (step S206), and when it is determined that the number of error bits is equal to or larger than the second threshold value N ("NO" in step S206), the encoding scheme selecting unit 342 proceeds to step S208. In the meantime, when it is determined that the number of error bits is less than the second threshold value N ("YES" in step S206), the encoding scheme selecting unit 342 changes the encoding scheme to the first encoding scheme having a low error correcting capability (step S207) and the encoding scheme selecting unit 342 proceeds to step S208.

In step S208, the encoding scheme selecting unit 342 determines whether to terminate the present operation (step S208), and when it is determined to terminate the present operation ("YES" in step S208), the encoding scheme selecting unit 342 terminates the present operation. In the meantime, when it is determined not to terminate the present operation ("NO" in step S208), the encoding scheme selecting unit 342 returns to step S202 and executes the subsequent operations.

As described above, in the present embodiment, the encoding scheme is selected based on the number of detected error bits for each decoding, thereby securing reliability of the data cached in the device use region 12B and improving use efficiency of the device use region 12B.

Since the other configurations, operations, and effects may be the same as those of the foregoing embodiment, overlapping descriptions will be omitted herein.

Third Embodiment

Next, a memory system according to a third embodiment will be described in detail with reference to the drawings. In the first or second embodiment described above, the case where the encoding scheme (or the error correcting capability) to be used is selected according to a situation of the entire device use region 12B is given as an example. In regards to this, in the present embodiment, the case where the device use region 12B is divided into a plurality of regions and the encoding scheme (or the error correcting capability) to be used is selected according to one or more factors related to each region will be described based on an example.

Since a configuration of a computer system including a memory system according to the present embodiment may be the same as the computer system 1 described with reference to FIG. 1 in the first embodiment, detailed description thereof will be omitted herein. However, in the present embodiment, the ECC unit 34 illustrated in FIG. 1 or 2 is replaced with an ECC unit 34A illustrated in FIG. 6. Further, in the present embodiment, an encoding scheme determining operation performed by an encoding scheme selecting unit 342 is an encoding scheme determining operation illustrated in FIG. 7. Further, in the present embodiment, the device use region 12B of the main memory 12 of the host 10 is divided into the plurality of regions.

For example, the device use region 12B is divided so that one region is formed with one block or several blocks based on the unit of a block that is a unit of write/read for the main memory 12. In each region, for example, the degree of fatigue based on the number of times of program/erase of each block may be managed by the host 10 or the memory system 20.

Figure 6:
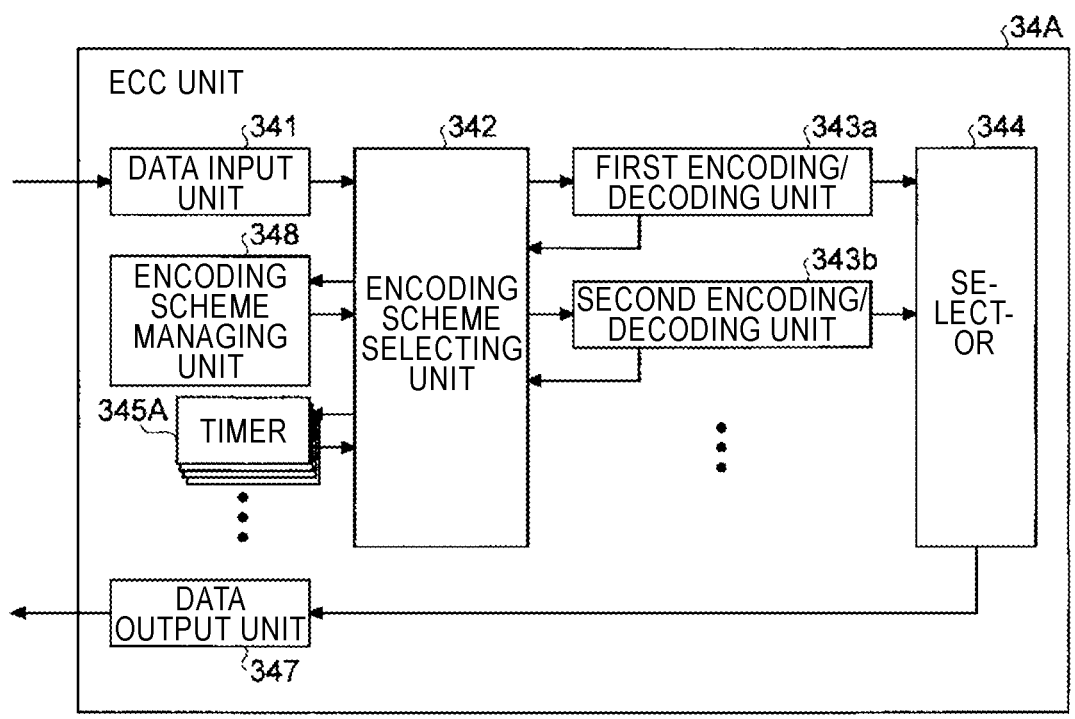
FIG. 6 is a detailed block diagram of an ECC unit according to a third embodiment.

The ECC unit 34A according to the present embodiment newly includes an encoding scheme managing unit 348, and includes a plurality of timers 345A instead of the timer 345 as illustrated in FIG. 6, compared to the configuration of the ECC unit 34 illustrated in FIG. 2.

The encoding scheme managing unit 348 manages a currently selected encoding scheme for each region of the device use region 12B. That is, the encoding scheme managing unit 348 manages an encoding/decoding unit (any one among the first encoding/decoding unit 343a, the second encoding/decoding unit 343b, . . . ) that is an input destination of the cache data read from each region of the device use region 12B.

The plurality of timers 345A corresponds one to one to the plurality of regions of the device use region 12B, respectively. Each of the timers 345A is a timer measuring a time elapsed from a specific timing, and for example, the timer 345A measures an elapsed time when it is determined whether a bit error is detected for the data read from the corresponding region in the device use region 12B within a predetermined time.

Figure 7:
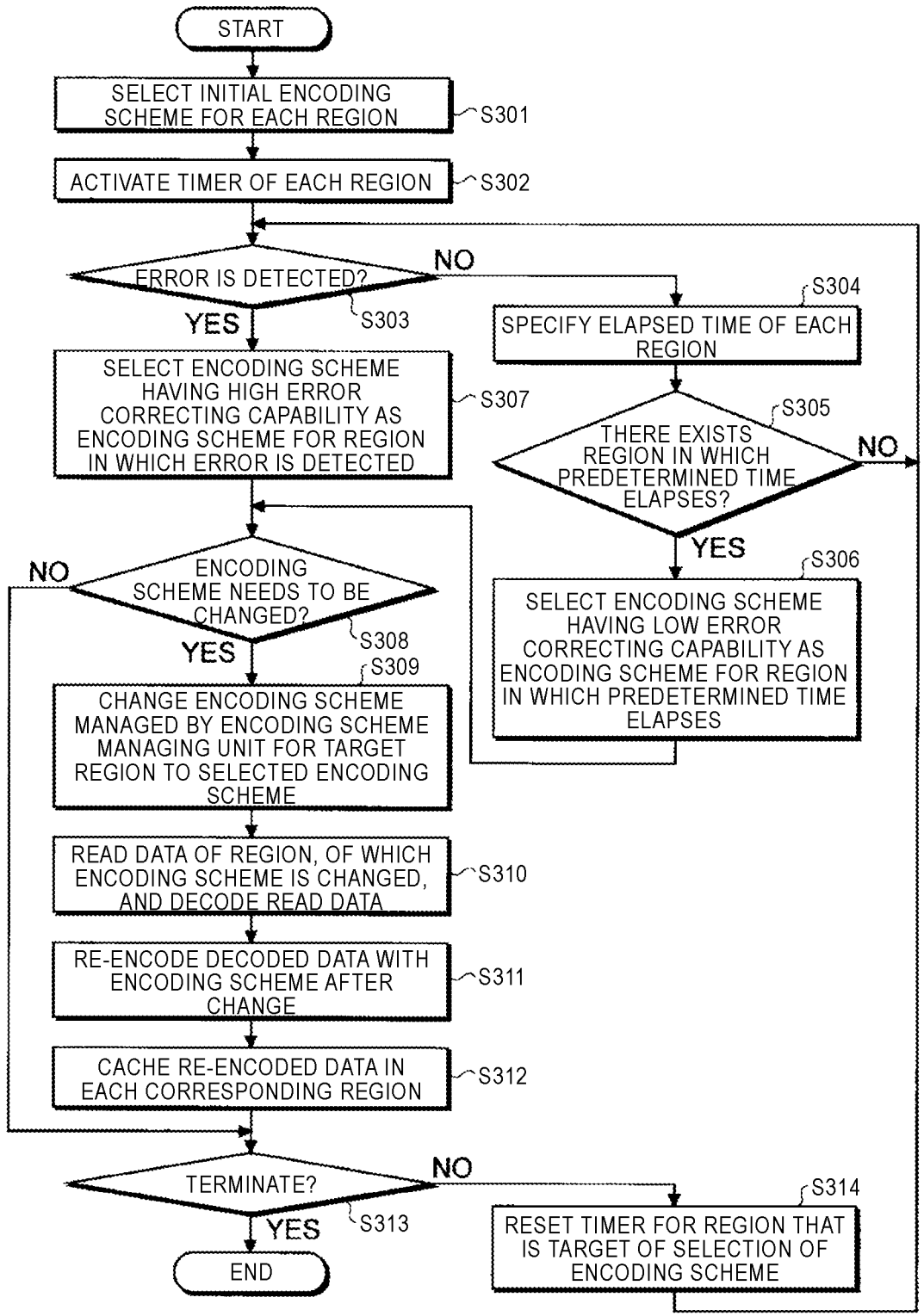
FIG. 7 is a flowchart illustrating an example of an encoding scheme determining operation of the third embodiment.

Next, an encoding scheme determining operation according to the present embodiment will be described. As illustrated in FIG. 7, in the encoding scheme operation according to the third embodiment, for example, when the ECC unit 34A is activated based on an instruction from the CPU 32, first, the encoding scheme selecting unit 342 selects, for each of the regions of the device use region 12B, an encoding scheme to be used in the initial state, that is, an encoding/decoding unit which encodes/decodes data cached in each region (step S301), as in step S101 of FIG. 3. Next, the encoding scheme selecting unit 342 activates the timers 345A and starts the measurement of an elapsed time for each of the regions (step S302).

Subsequently, the encoding scheme selecting unit 342 determines whether the first encoding/decoding unit 343a or the second encoding/decoding unit 343b detects an error for the data read from each region of the device use region 12B (step S303). When it is determined that the error is detected ("YES" in step S303), the encoding scheme selecting unit 342 selects an encoding scheme (which corresponds to the second encoding/decoding unit 343b) having a high error correcting capability as an encoding scheme for the region in which the error is detected (step S307), and the encoding scheme selecting unit 342 proceeds to step S308. In the meantime, when it is determined that the error is not detected ("NO" in step S303), the encoding scheme selecting unit 342 specifies an elapsed time for each region by referring to the timer 345A (step S304) and determines whether there exists a region in which a predetermined time elapses (step S305). When it is determined that there does not exist the region in which the predetermined time elapses ("NO" in step S305), the encoding scheme selecting unit 342 returns to step S303. In the meantime, when it is determined that there exists the region in which the predetermined time elapses ("YES" in step S305), the encoding scheme selecting unit 342 selects an encoding scheme (which corresponds to the first encoding/decoding unit 343a) having a low error correcting capability as an encoding scheme for the region in which the predetermined time elapses (step S306), and the encoding scheme selecting unit 342 proceeds to step S308.

In step S308, the encoding scheme selecting unit 342 compares the currently selected encoding scheme of each region with the encoding scheme selected in step S306 or S307 by referring to the encoding scheme managing unit 348, and determines whether there exists a region in which the encoding scheme needs to be changed. When it is determined that there is no region in which the encoding scheme needs to be changed ("NO" in step S308), the encoding scheme selecting unit 342 proceeds to step S313. In the meantime, when it is determined that there is a region in which the encoding scheme needs to be changed ("YES" in step S308), the encoding scheme selecting unit 342 changes the encoding scheme managed by the encoding scheme managing unit 348 to the encoding scheme selected in step S306 or S307 for the region in which the encoding scheme needs to be changed (step S309).

Subsequently, the encoding scheme selecting unit 342 reads and decodes the data cached in the region within the device use region 12B in which the encoding scheme managed by the encoding scheme managing unit 348 is changed (step S310), and subsequently, re-encodes the decoded data with the encoder/decoder (the first encoding/decoding unit 343a or the second encoding/decoding unit 343b) of the encoding scheme managed by the encoding scheme managing unit 348 (step S311). Then, the encoding scheme selecting unit 342 caches the encoded data obtained by the re-encoding in the corresponding region of the device use region 12B (step S312) and proceeds to step S313.

In step S313, the encoding scheme selecting unit 342 determines whether to terminate the present operation, and when it is determined to terminate the present operation ("YES" in step S313), the encoding scheme selecting unit 342 terminates the present operation. In the meantime, when it is determined not to terminate the present operation ("NO" in step S313), the encoding scheme selecting unit 342 resets the timer 345A for the region that is a target of the selection of the encoding scheme in step S306 or S307 (step S314), and then, returns to step S303 to execute the subsequent operations.

As described above, in the present embodiment, the device use region 12B may be divided into the plurality of regions, and an encoding scheme (or an error correcting capability) to be used may be selected based on a situation on whether a bit error occurs or a situation on whether a bit error easily occurs for each region, so that the amount of calculation of the decoding and the re-encoding generated when the encoding scheme is changed may be decreased.

Since the other configurations, operations, and effects may be the same as those of the foregoing embodiments, overlapping descriptions will be omitted herein.

In the third embodiment described above, the case where the encoding scheme is appropriately changed for each of the plurality of divided regions of the device use region 12B as the targets is given as an example. However, the present disclosure is not limited thereto, and the encoding scheme may be appropriately changed for some regions of the plurality of regions as the targets.

Otherwise, the encoding scheme having the high error correcting capability (e.g., which corresponds to the second encoding/decoding unit 343b) may be allocated to the region in which the data having high significance is cached, or the region which is set such that the data having high significance is cached, among the plurality of divided regions of the device use region 12B, and the encoding scheme having the low error correcting capability (for example, which corresponds to the first encoding/decoding unit 343a) may be allocated to other regions.

Fourth Embodiment

Next, a memory system according to a fourth embodiment will be described in detail with reference to the drawings. In the first to third embodiments, the case where the encoding scheme of the data cached in the device use region 12B installed at a part of the main memory 12 at the side of the host 10 is changed according to one or more factors is given as an example. In regards to this, in the present embodiment, the case where an encoding scheme of data to be cached in a DRAM and the like embedded in the memory system is changed according to one or more factors will be described based on an example.

Figure 8:
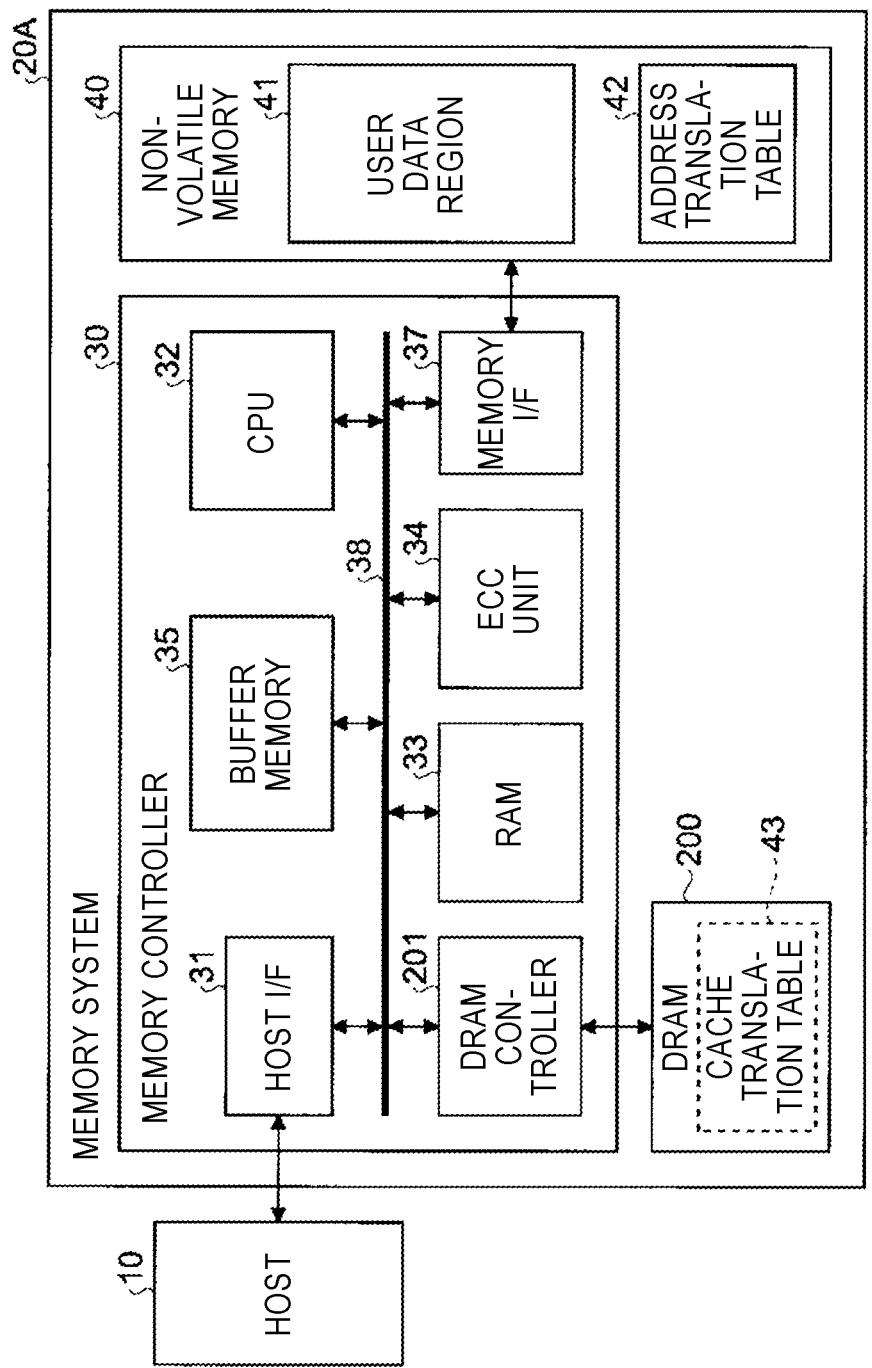
FIG. 8 is a schematic block diagram of a memory system according to a fourth embodiment.

FIG. 8 is a schematic block diagram of the memory system according to the present embodiment. As illustrated in FIG. 8, a memory system 20A according to the present embodiment further includes a DRAM 200 in addition to the configuration of the memory system 20 illustrated in FIG. 1, and the memory controller 30 further includes a DRAM controller 201.

The DRAM 200 is a memory usable as a working memory which stores an address translation table, various management tables such as a master table read from a specific region of a non-volatile memory 40 and loaded during an activation and the like, or log information that records changes to various management tables. Further, the DRAM 200 may also be used as a cache memory when data is transmitted between the host 10 and the non-volatile memory 40.

The DRAM controller 201 is a controller which controls access from the memory controller 30 to the DRAM 200, for example, a controller which enables access to the DRAM 200 in a double data rate (DDR).

In this configuration, for example, when the data, such as the address translation table 42, stored in the non-volatile memory 40 is cached in the DRAM 200, the ECC unit 34 executes an operation corresponding to that of any one of the first to third embodiments for the cache data. Accordingly, an encoding scheme of the data to be cached in the DRAM 200 embedded in the memory system 20A may be changed according to whether a bit error occurs or whether a bit error easily occurs, thereby securing reliability of the data cached in the DRAM 200 and improving use efficiency of the DRAM 200.

Since the other configurations, operations, and effects may be the same as those of the foregoing embodiments, overlapping descriptions will be omitted herein.

Fifth Embodiment

Figure 9:
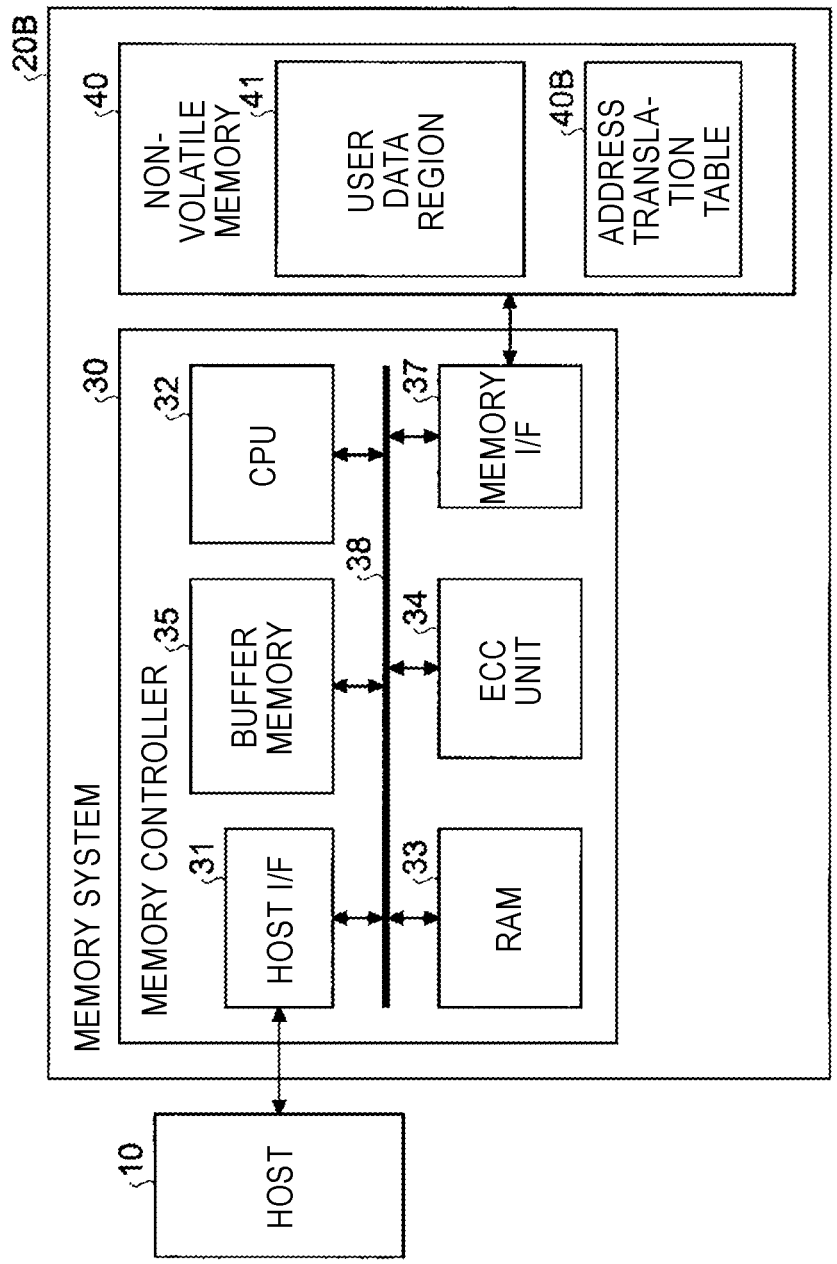
FIG. 9 is a schematic block diagram of a memory system according to a fifth embodiment.

Like a memory system 20B illustrated in FIG. 9, a partial region (a device use region 40B) of a non-volatile memory 40 may be used as a working memory of the memory controller 30.

In this case as well, for example, similar to the fourth embodiment, when data such as an address translation table is cached in the device use region 40B within the non-volatile memory 40, the ECC unit 34 executes the same operation as that of any one of the first to third embodiments for the cache data. Accordingly, an encoding scheme of the data cached in the device use region 40B within the non-volatile memory 40 may be changed according to a bit error occurrence situation or a situation about whether a bit error easily occurs, thereby securing reliability of the data cached in the device use region 40B and improving use efficiency of the non-volatile memory 40.

Since the other configurations, operations, and effects may be the same as those of the foregoing embodiments, overlapping descriptions will be omitted herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
   a non-volatile memory; and
   a controller configured to store data in the non-volatile memory, and cause data to be stored in a memory region within the host, which is divided into a plurality of regions including first and second regions and read from the memory region within the host, wherein the controller includes:
   a first encoding/decoding circuit configured to execute encoding/decoding with a first encoding scheme;
   a second encoding/decoding circuit configured to execute encoding/decoding with a second encoding scheme having a higher error correcting capability than an error correcting capability of the first encoding scheme; and
   an encoding scheme selecting circuit configured to select one of the first encoding/decoding circuit and the second encoding/decoding circuit to perform encoding of data to be stored in the first region, based on information about the data stored in the first region, and to select one of the first encoding/decoding circuit and the second encoding/decoding circuit to perform encoding of data to be stored in the second region, based on information about the data stored in the second region, wherein
   the information about the data stored in the first region includes whether or not a bit error is detected in the data read from the first region within a first predetermined time during decoding of the data performed by the encoding/decoding circuit selected by the encoding scheme selecting circuit, and
   the information about the data stored in the second region includes whether or not a bit error is detected in the data read from the second region within a second predetermined time during decoding of the data performed by the encoding/decoding circuit selected by the encoding scheme selecting circuit.

2. The memory system according to claim 1, wherein an encoding ratio of the second encoding scheme is higher than an encoding ratio of the first encoding scheme, the encoding ratio being a ratio of a length of redundant bits divided by a length of a sum of the redundant bits and information bits.

3. The memory system according to claim 1, wherein the controller includes a first timer for tracking whether or not bit error detection in the data read from the first region occurs within the first predetermined time, and a first timer for tracking whether or not bit error detection in the data read from the second region occurs within the second predetermined time.

4. The memory system according to claim 1, wherein when an encoding/decoding circuit for encoding/decoding data stored in the first or second region is changed, the encoding scheme selecting circuit decodes the data read from the first or second region with the encoding/decoding circuit that was used to encode the data, re-encodes the decoded data with the changed encoding/decoding circuit, and then, updates the data within the first or second region to the re-encoded data.

5. The memory system according to claim 1, wherein when the encoding/decoding circuit fails to decode the data read from the first or second region, the encoding scheme selecting circuit deletes the data within the first or second region.

6. The memory system according to claim 1, wherein when the reliability of the data read from the first or second region is high, the encoding scheme selecting circuit stores the data to be stored in the first or second region in the memory region without encoding the data by the first encoding/decoding circuit or the second encoding/decoding circuit.

7. The memory system according to claim 1, wherein the memory region within the host is usable by the memory system.

8. The memory system according to claim 7, wherein the controller is configured to cause data representing a relation between a logical address and a physical address to be stored in the memory region within the host.

* * * * *